(12) United States Patent
Mattison (10) Patent No.: US 6,629,190 B2
(45) Date of Patent: *Sep. 30, 2003

(54) NON-REDUNDANT NONVOLATILE MEMORY AND METHOD FOR SEQUENTIALLY ACCESSING THE NONVOLATILE MEMORY USING SHIFT REGISTERS TO SELECTIVELY BYPASS INDIVIDUAL WORD LINES

(75) Inventor: Phillip E. Mattison, Gilbert, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/035,724

(22) Filed: Mar. 5, 1998

(65) Prior Publication Data

US 2001/0010656 A1 Aug. 2, 2001

(51) Int. Cl.[7] .......................... G06F 12/00; G11C 16/08
(52) U.S. Cl. ..................... 711/101; 711/103; 711/219; 365/185.23; 365/200; 365/240
(58) Field of Search ............................... 711/109, 110, 711/103, 101, 219; 365/189.12, 240, 73, 78, 200, 201, 185.23

(56) References Cited

U.S. PATENT DOCUMENTS 5,255,226 A * 10/1993 Ohno et al. ............ 365/189.12
5,768,196 A * 6/1998 Bloker et al. .......... 365/189.12
5,968,190 A * 10/1999 Knaack ...................... 714/719

* cited by examiner

Primary Examiner—Glenn Gossage
(74) Attorney, Agent, or Firm—Blakely, Sokoloff, Taylor & Zafman LLP (57) ABSTRACT

A memory including a plurality of memory word lines and a sequential addressing circuit is provided. The sequential addressing circuit comprises at least one sequential shift register including at least one logic gate and at least one word flag cell for each of the word lines. Enablement of each memory word line depends upon the state of the word flag cell. An enable or access bit is shifted sequentially through the sequential. addressing circuit to select each of the word lines. The enable or access bit selectively bypasses or skips a word line depending on the state of its corresponding word flag cell. A method for accessing a nonvolatile writeable memory is also described. The method comprises determining at least one non-operational or defective memory bit cell of a nonvolatile writeable memory. At least one word line of the nonvolatile writeable memory is masked out, wherein the at least one word line is coupled to the at least one non-operational operational memory bit cell. The nonvolatile writeable memory is sequentially addressed in read and write cycles, wherein the at least one word line coupled to the at least one non-operational memory bit cell is bypassed. The sequential shift register may include a plurality of Johnson counter shift registers.

31 Claims, 5 Drawing Sheets

NON-REDUNDANT NONVOLATILE MEMORY AND METHOD FOR SEQUENTIALLY ACCESSING THE NONVOLATILE MEMORY USING SHIFT REGISTERS TO SELECTIVELY BYPASS INDIVIDUAL WORD LINES

FIELD OF THE INVENTION

The present invention relates generally to sequentially addressing a memory device and, more particularly, to providing a fault-tolerant redundant addressing mechanism for sequentially addressing memory arrays.

BACKGROUND OF THE INVENTION

Many computing systems such as personal computers, automotive and airplane control, video cameras, digital cameras, cellular phones, and handheld communication devices use nonvolatile writeable memories to store either data, or code, or both. Such nonvolatile writeable memories include Electrically Erasable Programmable Read-Only Memories (EEPROMs) and flash Erasable Programmable Read-Only Memories (flash EPROMs, or flash memories). Nonvolatility is advantageous for allowing the computing system to retain its data and code when power is removed from the computing system. Thus, if the system is turned off or if there is a power failure, there is no loss of code or data.

Nonvolatile semiconductor memory devices are fundamental building blocks in prior art computer system designs. The primary mechanism by which data is stored in nonvolatile memory is the memory cell. One type of prior nonvolatile semiconductor memory is the flash electrically-erasable programmable read-only memory (flash EEPROM). Prior art flash EEPROMs typically allow for the simultaneous reading of several flash cells. Further, typical prior art flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic in the flash EEPROM selects the corresponding flash cell.

Figure 1:
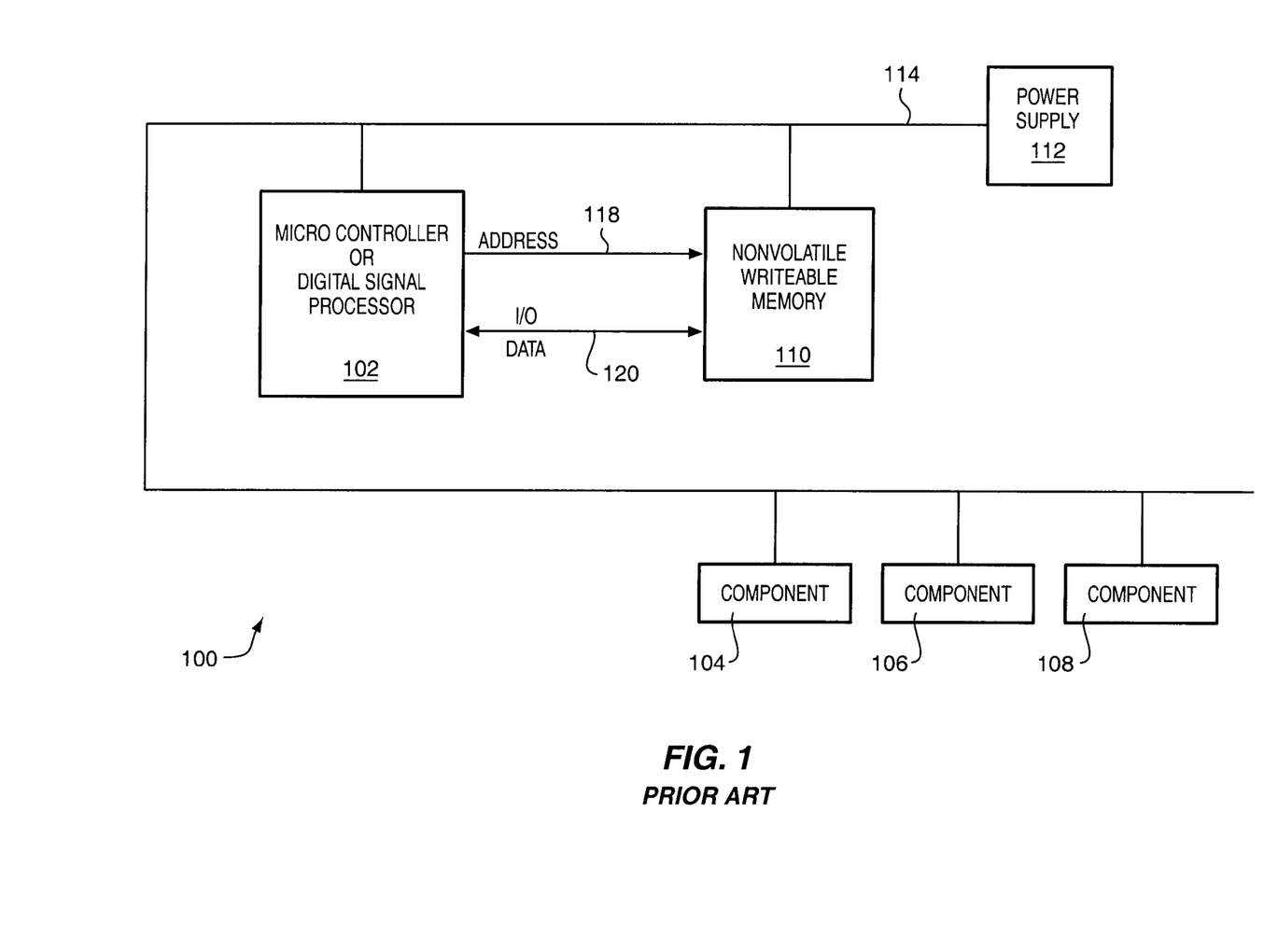
FIG. 1 is a block diagram of a prior art system including nonvolatile writeable memory.

FIG. 1 is a block diagram of a prior art system 100 including nonvolatile writeable memory. This system includes a microcontroller or digital signal processor (DSP) 102 and system components 104–108. System components 104–108 can be any other electronic components of the system 100 which, for example, might include but are not limited to additional memory components like static random access memory (SRAM), EPROM, and EEPROM. The microcontroller or DSP 102 communicates with the nonvolatile writeable memory 110 via address lines 118 and input/output (I/O) data lines 120. A power supply 112 provides a voltage on line 114 to the nonvolatile writeable memory 110 as well as to the system microcontroller or DSP 102, and system components 104–108.

Figure 2:
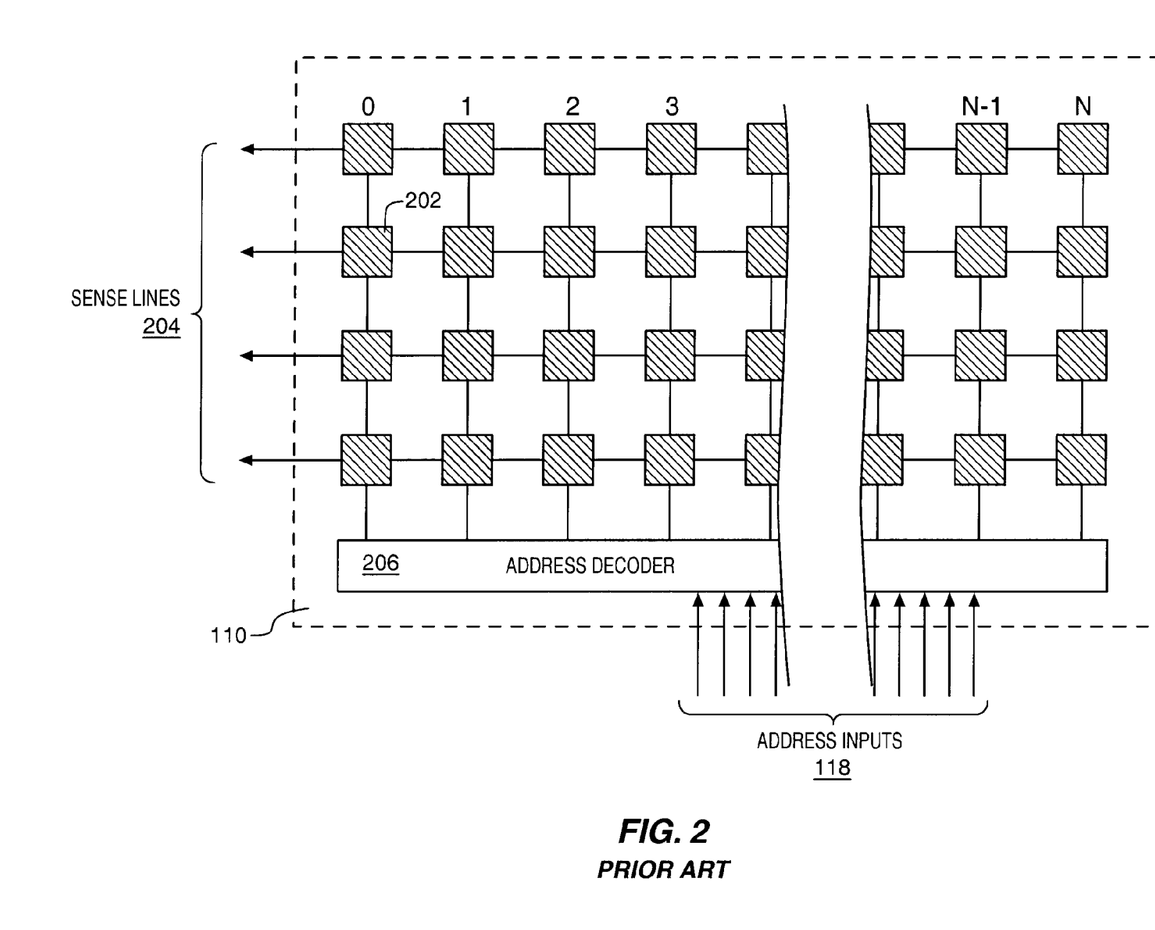
FIG. 2 is a typical prior art nonvolatile writeable memory device.

FIG. 2 is a typical prior art nonvolatile writeable memory device 110. This memory device 110 comprises a two-dimensional array of single-bit memory cells 202. A first dimension is defined by sense lines 204 that carry data from any row in the array to the input/output (I/O) connections. The number of sense lines 204 may range from one to the number of columns in the array. A second dimension is defined by word lines 0–N that identify which row of the array will be sensed by the sense lines. Typical prior art decoding logic provides that these word lines are typically controlled by an address decoder 206 so that a row number encoded as an address can be used to selectively enable a row in the array. The address decoder 206 provides random access to the memory cells 202 of the two-dimensional array by decoding the address inputs 118 to a unique word line and enabling that corresponding group of memory cells to be read or written using the sense lines 204.

For a typical time-based data type, or streaming data type, a memory device that provides linear access is fundamentally more efficient than one which offers random access. Streaming data types include, but are not limited to, video image data, still image data, audio data, and other natural data types. Linear access is more efficient because linear access is inherently simpler to implement. With the recent proliferation of digital cameras and other devices used for capturing natural data types using digital storage media, there has been a significant rise in the use of flash memory for digital storage of this data. The problem is that because flash memory is typically considered as an evolution of other types of random-access computer memory, it is typically implemented in a streaming data type application using the random access provided by an address decoding addressing mechanism, even though the random access is not necessary. This increases the cost and complexity of the time-based data device while decreasing the efficiency of the device.

A prior art exception to the typical random access solid state memory device is the first-in, first-out (FIFO) memory device. The FIFO memory is typically formed from shift registers used in parallel. These register memories typically have independent input and output buses. At the input port, data is controlled by a shift-in clock operating in conjunction with an input ready signal which indicates whether the memory is able to accept further words or is now full. The data entered is automatically shifted in parallel to the adjacent memory location if it is empty and as this continues the data words stack up at the output end of the memory. At the output port, data transfers are controlled by a shift-out clock and its associated output ready signal. The output ready signal indicates either that a data word is ready to be shifted out or that the memory is now empty. The FIFO memory can be cascaded to any desired depth and operated in parallel to give any required word length. Due to the nature of the program and erase operations in nonvolatile writeable memories, however, the FIFO data accessing scheme is not viable because it does not provide any memory cell redundancy.

Memory cell redundancy is used in typical prior art nonvolatile writeable memory to reduce the impact of memory cell failure during the use or manufacture of the memory. Memory cell failure can occur in nonvolatile writeable memory as a result of the continuous application of voltage in the programming and erasing of memory cell transistors. Memory cell redundancy is the process wherein extra cells comprising bit lines and word lines, and the associated multiplexing circuitry, are included in the memory array. In the event of a failure of memory cells of the array, the redundant cell lines or cell blocks are mapped into the memory array to replace the failed memory cells and provide a memory array that is 100% functional. The problem with providing redundant memory cells in a memory array is that the redundant cells consume valuable silicon area as well as increase the cost of the memory device.

SUMMARY OF THE INVENTION

A memory comprising an addressing circuit is provided. The addressing circuit comprises at least one sequential shift register and at least one corresponding logic gate and at least one corresponding word flag cell coupled to each of the memory word lines. Enablement of the each memory word line depends upon the state of the word flag cell.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A memory comprising a sequential addressing circuit is described wherein the sequential addressing circuit linearly addresses the memory when reading and writing time-based, or streaming, data. The sequential addressing circuit provides for the masking out of any memory word lines that comprise at least one non-operational memory bit cell as indicated by a word flag cell. The masked-out memory word lines are bypassed during memory read and write cycles. Consequently, an address decoder and redundant memory cells are not required. Intended advantages of the addressing circuit can include increased efficiency in accessing the memory, increased speed in accessing the memory, reduced cost, reduced silicon area, and the incorporation of fault tolerance with little overhead logic. The addressing circuit described herein is described in the context of a nonvolatile writeable memory, or flash memory, but is not so limited.

In recording streaming data including, but not limited to, a still image or picture, an audio data stream, or a video sequence comprising multiple images, a memory is typically addressed in a sequential manner. Starting at a beginning address, for example address zero, a first word of data is written. Following the incrementing of the memory address to the next location the next word is written. This process is repeated until the entire collection of data comprising the images or audio sequence is stored. To playback, view, or transfer the streaming data, a first word of data is read from the beginning address. Following the incrementing of the memory address to the next location the next word is read. This process is repeated until the entire collection of data comprising the images or audio sequence is read.

Figure 3:
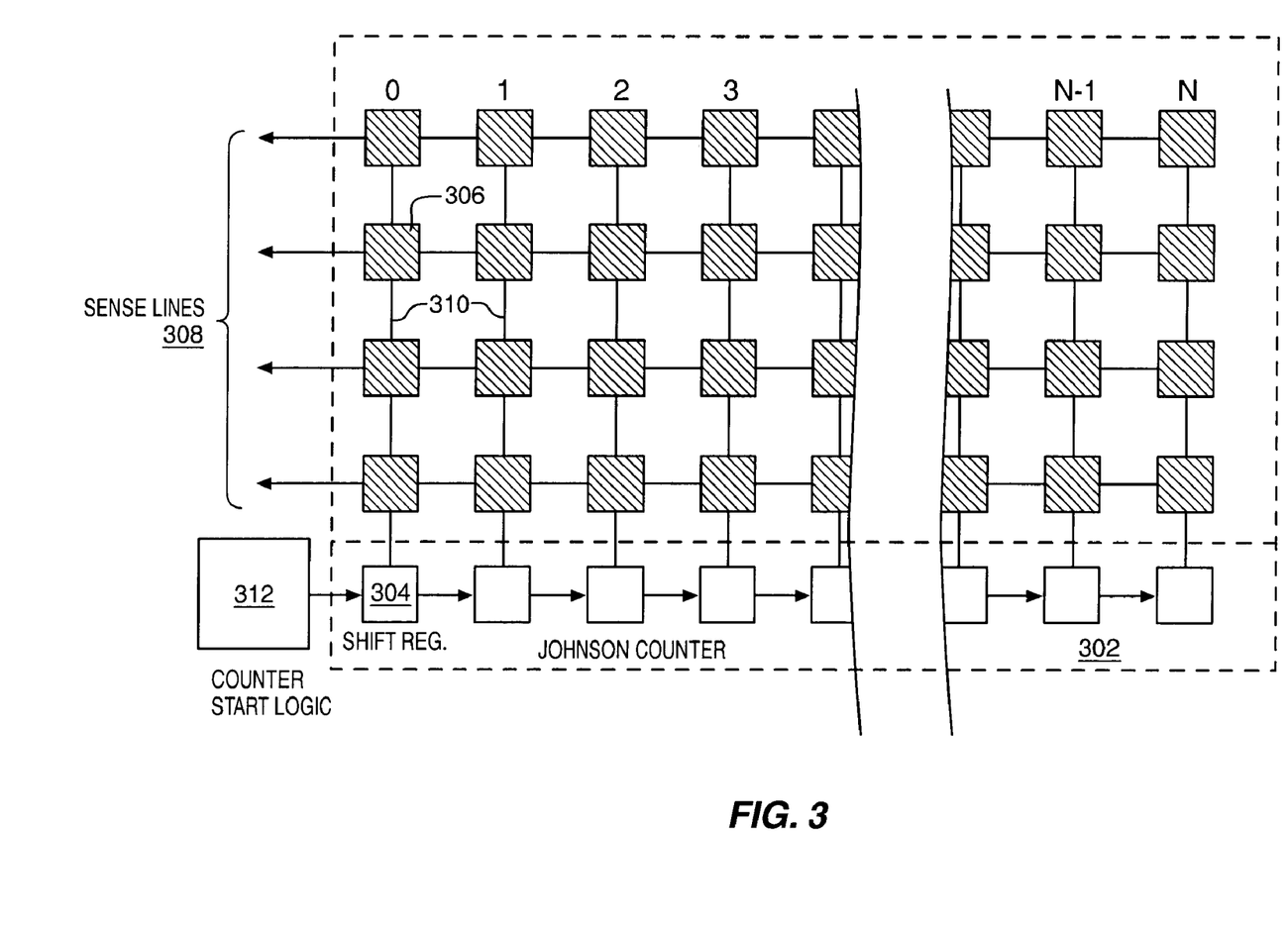
FIG. 3 is a block diagram of a memory array comprising the sequential addressing circuit of one embodiment.

FIG. 3 is a block diagram of a memory array 300 comprising the sequential addressing circuit 302 of one embodiment. The addressing circuit 302 comprises a number of Johnson counter shift registers 304 coupled to an array of flash memory bit cells 306, but the embodiment is not so limited. The array of flash memory bit cells 306 comprises N columns of memory bit cells 306 arranged in four rows, but the embodiment is not so limited. Sense lines 308 couple each of the memory bit cells 306 to I/O connections thereby providing data to and from any row in the array. Word lines 310 couple the memory bit cells 306 to form words in the memory. The word lines 310 couple each word to a shift register 304 of the Johnson counter 302.

In operation, the Johnson counter 302, as a substitute for an address decoder, shifts an access or enable bit through the array of shift registers 304 to select each word line 0–N in sequence. The counter start logic 312 resets all Johnson counter shift register bits to zero except the first bit so that a first read or write operation causes the first word line 0 to be enabled; during a read operation, data is provided from the memory bit cells 306 of the first word line 0 to the I/O lines, and during a write operation, data is provided to the memory bit cells 306 of the first word line 0 from the I/lines. Each successive read or write operation causes the access or enable bit to shift to the next Johnson counter shift register 304 thereby enabling the remaining word lines 1–N in sequential fashion. As discussed herein, logic associated with each Johnson counter shift register 304 causes the enable or access bit to bypass any shift register coupled to a memory word comprising a non-functional memory bit cell 306. Therefore, any memory word comprising a non-functional memory bit cell 306 is not selected by the enable bit during read and write operations from the memory array 300.

A data transfer may begin at some location other than the zero word line. This is accomplished in one embodiment by using the start logic to reset the counter and then clocking it the appropriate number of times to position the read/write pointer at the desired word line position. As there is no binary address decoder, the memory array can have any arbitrary memory bit cell dimension and is not restricted to a dimension that is a power of two.

Figure 4:
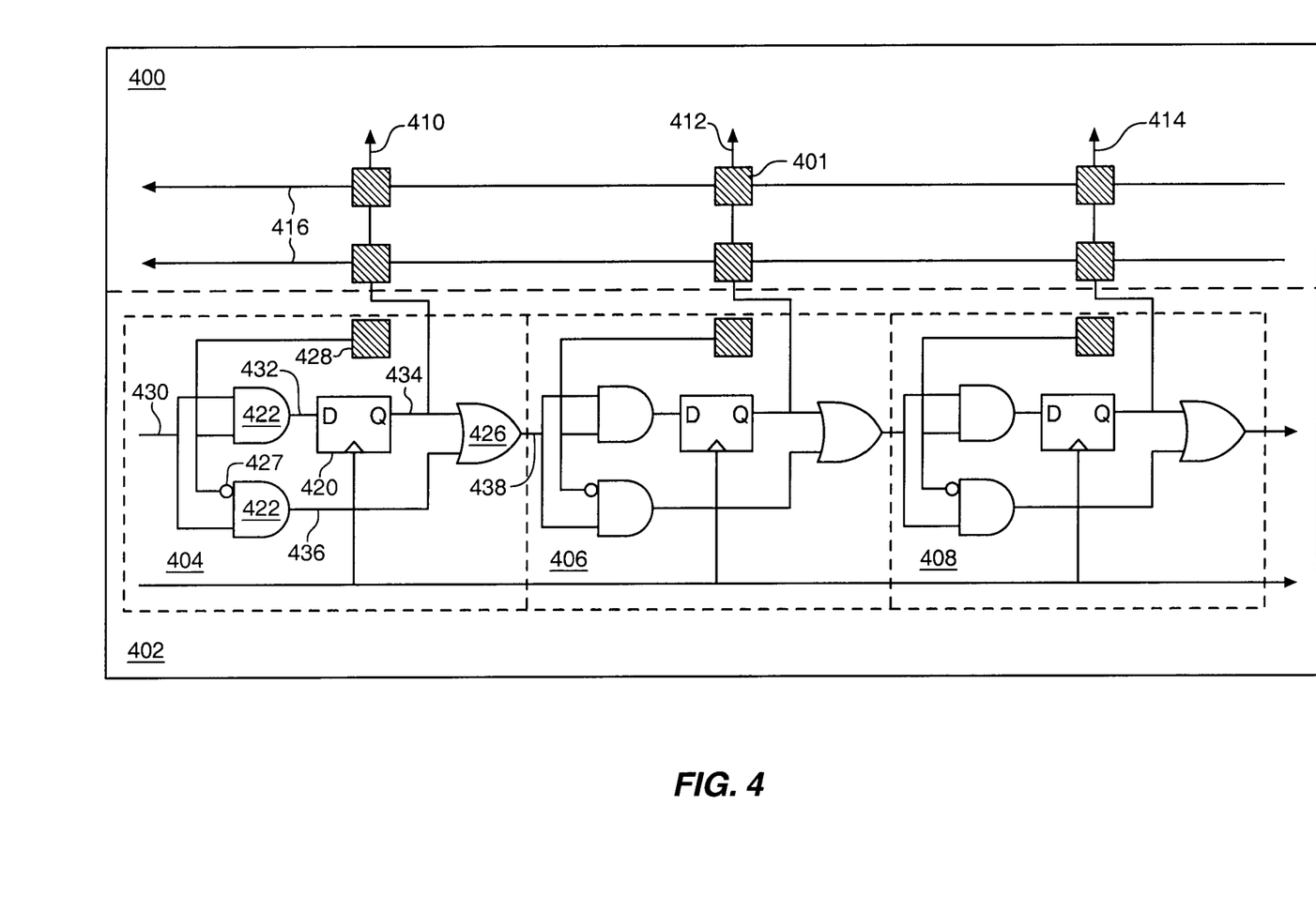
FIG. 4 is a diagram of a memory array including a more detailed schematic of the sequential addressing circuit of one embodiment.

FIG. 4 is a schematic of a memory array 400 comprising the sequential addressing circuit 402 of one embodiment. This sequential addressing circuit 402 comprises three Johnson counter shift registers 404, 406, 408 coupled to three word lines 410, 412, 414 coupled to memory bit cells 401 arranged in two rows, but the embodiment is not so limited. Sense lines 416 couple each of the memory bit cells 401 to the I/O connections thereby providing data to and from any row in an array. Word lines 410, 412, 414 couple each memory word, comprising memory bit cells 401, to a Johnson counter shift register 404, 406, 408. Each Johnson counter shift register 404, 406, 408 comprises a flip-flop 420, logic gates 422, 424, 426 and a word flag cell 428. The logic gates 422, 424, 426 allow word lines containing non-operational memory bit cells to be skipped during read and write cycles. Furthermore, the one additional storage bit, or word flag cell 428, used per word in conjunction with the logic gates 422, 424, 426 indicates whether the associated memory word is operational.

In one embodiment, the input 430 to each shift register 404–408 of the sequential addressing circuit 402 is coupled to each of a first and a second AND logic gate 422 and 424. The word flag cell 428 of the particular word line is also coupled to the first and second AND logic gates 422 and 424, with the input to the second AND logic gate 424 being coupled through an inverter 427. The output 432 of the first AND logic gate 422 is coupled to the flip-flop 420. The output 434 of the flip-flop 420 is coupled to a first input of an OR logic gate 426 and to the associated word line. The output 436 of the second AND logic gate 424 is coupled to a second input of the OR logic gate 426. The output of the OR logic gate 426 is the output of the shift register 404.

In the operation of one embodiment, following a test of the memory system in which failed, or non-operational, memory bit cells are determined, the word flag cell 428 of each shift register 404–408 is programmed. The word flag cell 428 is programmed as a logic one if all memory bit cells 401 of the associated memory word are operational, and the word flag cell 428 is programmed as a logic zero if any memory bit cells 401 of the associated memory word are non-operational. In sequentially reading to and writing from the memory array 400, an enable bit is shifted into the first Johnson counter shift register 404 of the sequential addressing circuit 402 by applying a logic one to the input of AND gates 422 and 424. If the first memory word line is enabled wherein the word flag cell 428 of the first shift register 404 contains a logic one, then the output 432 of AND gate 422 is asserted and the output 436 of AND gate 424 is not asserted. The asserted output 432 of AND gate 422 activities flip-flop 420 and causes the output 434 of flip-flop 420 to select the first memory word line; data is read from or written to the selected first memory word using the sense lines 416. The asserted output 434 of flip-flop 420 is input into OR gate 426 which causes the logic one to be sequentially shifted into the next shift register 406 of the Johnson counter 402.

If the first memory word is not enabled, wherein the word flag cell 428 of the first shift register 404 contains a logic zero, then the output 432 of AND gate 422 is deasserted and the output 436 of AND gate 424 is asserted. The deasserted output 432 of AND gate 422 does not activate flip-flop 420 and does not cause the selection of the associated memory word line. The asserted output 436 of AND gate 424 is input into OR gate 438 which causes the logic one to bypass the memory word line associated with the first shift register 404 while being sequentially shifted into the next shift register 406 of the Johnson counter 402. This sequential shifting of the enable bit continues through all shift registers of the Johnson counter. A series of logic zero bits follow the enable bit as it is shifted through the Johnson counter. By adding circuits to allow cascading of these devices, both in word width and memory depth, a highly flexible and cost effective method of implementing large linear storage arrays becomes possible.

Figure 5:
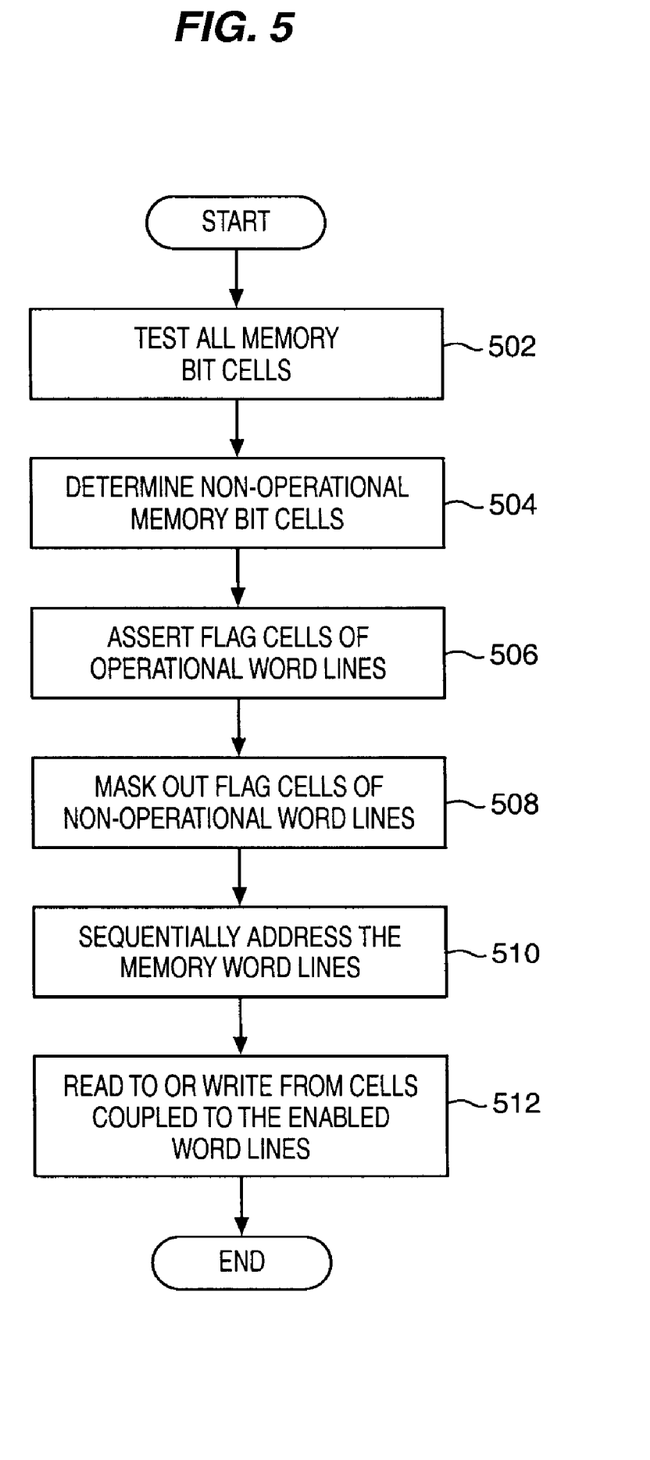
FIG. 5 is a flow chart for the operation of the addressing circuit of one embodiment.

FIG. 5 is a flow chart for the operation of the addressing circuit of one embodiment. It is noted that the programming and erasing of the flash memory array of one embodiment operates the same as in prior art flash devices. Operation begins at step 502, at which all memory bit cells of the memory array are tested. During the manufacturing of the memory array, all memory bit cells are erased to a logic one state, including the word flag cells, thereby enabling access to all memory words within the device. Testing proceeds by sequentially programming or writing bit patterns into the memory array and reading the bit patterns back and comparing them with the bit patterns programmed, erasing the array between verifying patterns. A record is kept during the testing of the failed memory bit cells.

At step 504, the results of the test are used to determine the non-operational memory bit cells. The word flag cells of the operational word lines are asserted, at step 506. The word flag cells of the non-operational word lines are masked out, at step 508. The non-operational or non-functional word lines are any failing words that are identified and cataloged by the test system as including any non-functioning memory bit cells. The masking out comprises setting the associated word flag cell bits of a non-operational word line to logic zero, disabling and thereby causing any word lines containing failing words to be bypassed by enable bits. During normal read and write operations of the memory array, a global bit (not shown) disables access to the word flag cell bits.

Operation continues at step 510, at which the Johnson counter is used to sequentially address the flash memory word lines. The sequential addressing of the memory array is performed by shifting at least one access bit, or enable bit, through the sequential shift register thereby enabling and selecting each of the enabled word lines in sequence. The word lines containing non-operational memory bit cells, as evidenced by a logic zero in the corresponding word flag cell, are skipped during read and write cycles. A first read or write operation causes the first word line to be selected, or enabled. At step 512, data is read from or written to the memory bit cells of the enabled word line. Each successive read or write operation causes the enable bit to shift to the next Johnson counter register thereby enabling or bypassing the remaining word lines in sequential fashion. Therefore, regardless of the number or locations of bad memory bit cells and words, the memory device described herein appears as a contiguous memory array to the user. As such, even memory devices with a high percentage of failed memory bits could still be used when used with the sequential addressing circuit described herein.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A flash memory, comprising:
   a plurality of memory cells to store data;
   a sequential addressing circuit, including at least one Johnson counter comprising
   a plurality of shift registers coupled to at least one word line which is coupled to the plurality of memory cells, each shift register of the at least one Johnson counter including at least one flip-flop coupled to the at least one word line, at least one logic gate and at least one corresponding word flag cell that indicates whether an associated group of memory cells of the plurality of memory cells is operational, wherein enablement of the at least one word line depends upon the state of the at least one corresponding word flag cell; and
   sense lines coupling each of the plurality of memory cells to input/output (I/O) connections to provide data to and from the flash memory.

2. The flash memory of claim 1, wherein at least one word line coupled to a non-operational memory bit cell is skipped during memory read and write cycles.

3. The flash memory of claim 1, wherein the sequential addressing circuit accesses the flash memory in a sequential manner for reading and writing of streaming data.

4. The flash memory claim 1, wherein the memory comprises a nonvolatile writeable memory.

5. The flash memory of claim 1, wherein the at least one word line is enabled when the at least one corresponding word flag cell is asserted.

6. The flash memory of claim 5, wherein at least one access bit is shifted sequentially through the shift registers of the at least one Johnson counter to select each word line having a corresponding flag bit cell asserted.

7. The flash memory of claim 6, wherein the at least one access bit bypasses the at least one word line when the at least one corresponding word flag cell is not asserted.

8. A nonvolatile writeable memory comprising:
   a plurality of memory cells to store data; and a sequential addressing circuit, including at least one Johnson counter shift register coupled to at least one corresponding word line which is coupled to the memory cells;

each Johnson counter shift register including at least one flip-flop, at least one logic gate and at least one word flag cell that indicates whether the associated memory word is operational coupled to the at least one word line, wherein the at least one word line is enabled when the word flag cell is asserted.

9. The nonvolatile writeable memory of claim 8, wherein the nonvolatile writeable memory comprises a plurality of memory bit cells arranged to form at least one word.

10. A nonvolatile writeable memory comprising:

a plurality of memory bit cells arranged to form at least one word; and at least one word line enabling access to the at least one word, an addressing circuit coupled to the at least one word line, wherein the addressing circuit comprises a plurality of sequential shift registers coupled to the at least one word line, wherein the plurality of sequential shift registers comprises at least one logic gate and at least one word flag cell coupled to the at least one logic gate, wherein the at least one word line is enabled when the at least one word flag cell is asserted, wherein the at least one word flag cell is asserted when all memory bit cells coupled to the at least one word line are operational; and at least one access bit is shifted sequentially through the plurality of sequential shift registers to select each word line having a corresponding word flag cell asserted.

11. The nonvolatile writeable memory of claim 10, wherein the at least one access bit bypasses the at least one word line when the word flag cell is not asserted.

12. A method for accessing a nonvolatile writeable memory, comprising:

determining at least one non-operational memory bit cell in the nonvolatile writeable memory;

asserting word flag cells corresponding to word lines which are coupled to operational memory bit cells;

masking out at least one word line of the nonvolatile writeable memory, wherein the at least one word line is coupled to the at least one non-operational memory bit cell; and bypassing words of the nonvolatile writeable memory that include one or more non-operational memory bit cells while sequentially addressing the nonvolatile writeable memory in read and write cycles, using a plurality of Johnson counter shift registers, by sequentially addressing word lines of the nonvolatile writeable memory, wherein the at least one word line coupled to the at least one non-operational memory bit cell is bypassed.

13. The method of claim 12, wherein masking out at least one word line comprises bypassing the at least one word line coupled to the at least one non-operational memory bit cell.

14. The method of claim 12, further comprising:

testing all memory bit cells of the nonvolatile writeable memory; and asserting at least one word flag cell corresponding to at least one word line which is coupled to an operational memory bit cell in response to the testing of the memory bit cells of the nonvolatile writeable memory.

15. The method of claim 12, further comprising enabling at least one word line of the nonvolatile writeable memory, wherein the enabled at least one word line is coupled to operational memory bit cells.

16. The method of claim 15, further comprising sequentially addressing the nonvolatile writeable memory by sequentially shifting at least one access bit through the plurality of Johnson counter shift registers to select each word line having a corresponding flag bit cell asserted.

17. A flash memory, comprising:

a plurality of memory cells to store data, none of the plurality of memory cells being redundant memory cells or being associated with redundant memory cells;

a sequential addressing circuit, coupled to at least one word line which is coupled to the plurality of memory cells, the sequential addressing circuit including at least one flip-flop coupled to the at least one word line, at least one logic gate and at least one corresponding word flag cell that indicates whether an associated group of memory cells of the plurality of memory cells is operational, wherein enablement of the at least one word line depends upon the state of the at least one corresponding word flag cell; and sense lines coupling each of the plurality of memory cells to input/output (I/O) connections to provide data to and from the flash memory.

18. The flash memory of claim 17, wherein individual word lines coupled to a non-operational memory bit cell are skipped during memory read and write cycles.

19. The flash memory claim 17, wherein at least one word line coupled to a non-operational memory bit cell is skipped during memory read and write cycles thereby decreasing the total number of memory cells of the plurality of memory cells that can be addressed by reducing the number of memory cells that are accessible by the sequential addressing circuit.

20. The flash memory of claim 17, wherein the at least one word line is enabled when the at least one corresponding word flag is asserted.

21. The flash memory of claim 17, wherein at least one access bit bypasses the at least one word line when the at least one corresponding word flag cell is not asserted.

22. The flash memory of claim 17, wherein the sequential addressing circuit accesses the flash memory in a sequential manner for reading and writing of streaming data.

23. The flash memory of claim 17, wherein the memory comprises a nonvolatile writeable memory.

24. A computer system, comprising:

a processor; and a storage device coupled to the processor, the storage device having stored thereon data representing sequences of instructions, the sequences of instructions which, when executed by a processor, cause the processor to:

determine at least one non-operational memory bit cell in a nonvolatile writeable memory;

assert word flag cells corresponding to word lines which are coupled to only operational memory bit cells;

mask out at least one word line of the nonvolatile writeable memory, wherein the at least one word line is coupled to the at least one non-operational memory bit cell; and sequentially address only those of the word lines associated with asserted word flag cells in read and write cycles, using a plurality of Johnson counter shift registers sequentially addressing word lines of the nonvolatile writeable memory and bypassing those of the word lines associated with non-asserted word flag cells including the at least one word line coupled to the at least one non-operational memory bit cell.

25. The computer system of claim 24, wherein masking out at least one word line comprises bypassing the at least one word line coupled to the at least one non-operational memory bit cell.

26. The computer system of claim 24, wherein the sequences of instructions which, when executed by the processor, further cause the processor to:

test all memory bit cells of the nonvolatile writeable memory; and assert at least one word flag cell corresponding to at least one word line which is coupled to an operational memory bit cell in response to the testing of the memory bit cells of the nonvolatile writeable memory.

27. The computer system of claim 24, wherein the sequences of instructions which, when executed by the processor, further cause the processor to enable at least one word line of the nonvolatile writeable memory, wherein the enabled at least one word line is coupled to operational memory bit cells.

28. The computer system of claim 27, wherein the sequences of instructions which, when executed by the processor, further cause the processor to sequentially address the nonvolatile writeable memory by sequentially shifting at least one access bit through the plurality of Johnson counter shift registers to select each word line having a corresponding flag bit cell asserted.

29. A memory comprising:

an array of memory cells to store data;

a plurality of word lines each coupling a group of memory cells of the array of memory cells to form a plurality of words; and a sequential addressing circuit coupled to the plurality of word lines, the sequential addressing circuit including a plurality of shift registers and corresponding word flag cells, those of the word flag cells associated with a word of the plurality of words having a defective memory cell having stored therein a bypass indication to enable word-level bypassing during sequential addressing of the plurality of words and to reduce the total number of words that are accessible in the memory.

30. The memory of claim 29, wherein the plurality of shift registers comprises a plurality of Johnson counter shift registers.

31. The memory of claim 29, further comprising sequentially addressing the memory by sequentially shifting at least one access bit through the plurality of shift registers to select each word line having a corresponding word flag cell asserted.

* * * * *